United States Patent
Uduki et al.

(10) Patent No.: US 10,229,521 B2
(45) Date of Patent: Mar. 12, 2019

(54) AREA CHARACTERISTIC DISPLAY DEVICE AND METHOD FOR CONTROLLING AREA CHARACTERISTIC DISPLAY DEVICE

(71) Applicant: Tokyo Electric Power Company Holdings, Incorporated, Tokyo (JP)

(72) Inventors: Tamotsu Uduki, Tokyo (JP); Shinya Iijima, Tokyo (JP); Yasuhiro Kinoshita, Tokyo (JP); Mituaki Oohara, Tokyo (JP); Yukio Koori, Tokyo (JP); Daisuke Yamaguchi, Tokyo (JP)

(73) Assignee: Tokyo Electric Power Company Holdings, Incorporated, Tokyo (JP)

( * ) Notice: Subject to any disclaimer, the term of this patent is extended or adjusted under 35 U.S.C. 154(b) by 0 days.

(21) Appl. No.: 15/459,329

(22) Filed: Mar. 15, 2017

(65) Prior Publication Data
US 2017/0186197 A1    Jun. 29, 2017

Related U.S. Application Data

(63) Continuation-in-part of application No. PCT/JP2014/081756, filed on Dec. 1, 2014.

(51) Int. Cl.
| | |
|---|---|
| *G06T 11/20* | (2006.01) |
| *G01R 13/02* | (2006.01) |
| *G01R 31/08* | (2006.01) |
| *G05B 17/00* | (2006.01) |

(52) U.S. Cl.
CPC ............ *G06T 11/206* (2013.01); *G01R 13/02* (2013.01); *G01R 31/085* (2013.01); *G01R 31/088* (2013.01); *G05B 17/00* (2013.01)

(58) Field of Classification Search
CPC combination set(s) only.
See application file for complete search history.

(56) References Cited

U.S. PATENT DOCUMENTS

| | | | | |
|---|---|---|---|---|
| 7,113,949 | B1* | 9/2006 | House | H04L 41/12 |
| 2010/0322390 | A1* | 12/2010 | Bialk | H04L 41/065 |
| | | | | 379/32.04 |

(Continued)

FOREIGN PATENT DOCUMENTS

| | | | |
|---|---|---|---|
| CN | 103995967 A | * | 8/2014 |
| EP | 2 634 420 A1 | | 9/2013 |

(Continued)

OTHER PUBLICATIONS

English Translation for CN103995967A.*

(Continued)

*Primary Examiner* — Ryan M Gray
(74) *Attorney, Agent, or Firm* — Drinker Biddle & Reath LLP

(57) ABSTRACT

An area characteristic display device includes an inputter which receives input of information that enables identification of state and position of equipment installed outdoors, and a display controller which displays, based on the information that enables identification of the state and position that has been input to the inputter, and data on area characteristics, a distribution of the state together with the data on area characteristics, on a display with being superimposed on a map.

6 Claims, 4 Drawing Sheets

(56) References Cited

U.S. PATENT DOCUMENTS

| | | | |
|---|---|---|---|
| 2012/0036464 A1* | 2/2012 | Rissanen | G05B 23/0272 715/771 |
| 2012/0317507 A1 | 12/2012 | Gutierrez et al. | |
| 2013/0006395 A1* | 1/2013 | Plache | G05B 19/0426 700/83 |
| 2013/0110558 A1* | 5/2013 | Maher | G06Q 40/08 705/4 |
| 2013/0181609 A1* | 7/2013 | Agrawal | H05B 37/03 315/131 |
| 2017/0013698 A1* | 1/2017 | Agrawal | H05B 37/03 |

FOREIGN PATENT DOCUMENTS

| | | |
|---|---|---|
| JP | H09-97260 A | 4/1997 |
| JP | 2004-183256 A | 7/2004 |
| JP | 2008-275568 A | 11/2008 |
| JP | 2010-97392 A | 4/2010 |
| JP | 2010-166702 A | 7/2010 |
| JP | 2011-198267 A | 10/2011 |
| JP | 2013-89186 A | 5/2013 |
| JP | 2014-174113 A | 9/2014 |
| JP | 2014-191367 A | 10/2014 |
| WO | WO-2012/056564 A1 | 5/2012 |

OTHER PUBLICATIONS

International Search Report dated Feb. 10, 2015 for PCT/2014/081756 (with attached English-language translation).
International Preliminary Report on Patentability dated Feb. 9, 2016 for PCT/JP2014/081756 (with attached English-language translation).
Japanese Office Action dated Jul. 5, 2016 from related Japanese patent application No. 2016-514178 (with attached English-language translation).

* cited by examiner

AREA CHARACTERISTIC DISPLAY DEVICE AND METHOD FOR CONTROLLING AREA CHARACTERISTIC DISPLAY DEVICE

BACKGROUND

Technical Field

Embodiments of the present invention generally relate to an area characteristic display device and a method for controlling the area characteristic display device.

Related Art

In related art, Japanese Unexamined Patent Application, First Publication No. 2013-089186 describes a state detection device for power equipment that detects the state of power equipment and displays the detection result on a display.

Nevertheless, there is no area characteristic display device which displays the state distribution of the power equipment together with data on area characteristics of environment conditions such as wind fluidity of a location where a power device is placed, on a display with being superimposed on a map. Thus, there has been such a disadvantage that evaluation determination of changing the design criterion of power equipment cannot be performed based on a display result.

SUMMARY

An area characteristic display device may include, but is not limited to, an inputter which receives input of information that enables identification of state and position of equipment installed outdoors; and a display controller which displays, based on the information that enables identification of the state and position that has been input to the inputter, and data on area characteristics, a distribution of the state together with the data on area characteristics, on a display with being superimposed on a map. The position is a location where the equipment is installed. The state is a state of a fault after a predetermined number of years have passed since the equipment had been installed on the position. The data on area characteristics is a roughness length in a roughness length distribution chart.

DETAILED DESCRIPTION OF THE EMBODIMENTS

Figure 1:
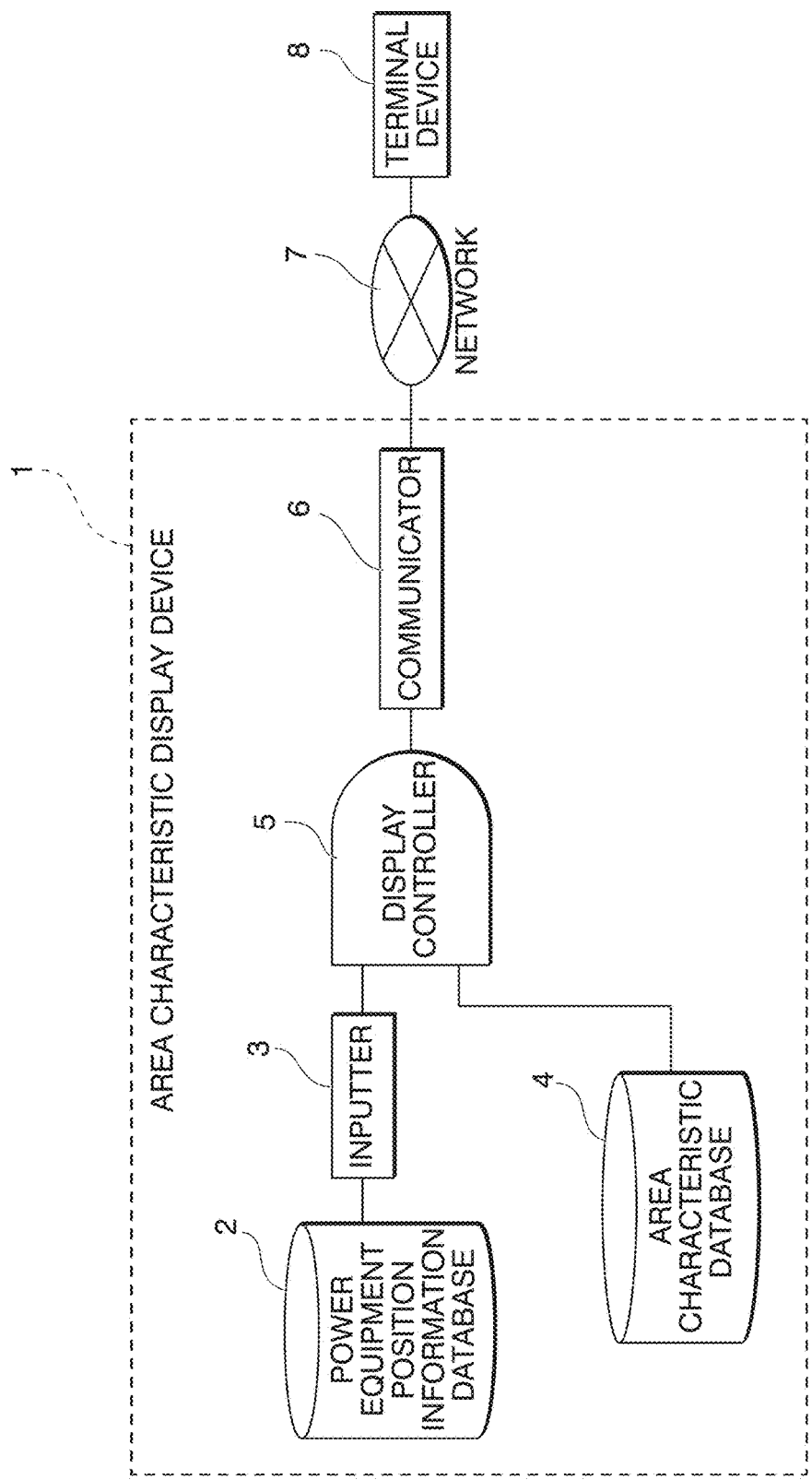
FIG. 1 is a diagram representing a configuration of an area characteristic display device 1.

In some embodiments, an area characteristic display device may include, but is not limited to, an inputter which receives input of information that enables identification of state and position of equipment installed outdoors; and a display controller which displays, based on the information that enables identification of the state and position that has been input to the inputter, and data on area characteristics, a distribution of the state together with the data on area characteristics, on a display with being superimposed on a map. The position is a location where the equipment is installed. The state is a state of a fault after a predetermined number of years have passed since the equipment had been installed on the position. The data on area characteristics is a roughness length in a roughness length distribution chart.

In other embodiments, an area characteristic display device may include, but is not limited to, an inputter which receives input of information that enables identification of state and position of equipment installed outdoors; and a display controller which displays, based on the information that enables identification of the state and position that has been input to the inputter, and data on area characteristics, a distribution of the state together with the data on area characteristics, on a display with being superimposed on a map. The position is a location where the equipment is installed. The state is a state of a fault after a predetermined number of years have passed since the equipment had been installed on the position. The data on area characteristics is data on an environment condition that causes the state.

In other embodiments, an area characteristic display device may include, but is not limited to, an inputter which receives input of information that enables identification of state and position of equipment installed outdoors; and a display controller which displays, based on the information that enables identification of the state and position that has been input to the inputter, and data on area characteristics, a distribution of the state together with the data on area characteristics, on a display with being superimposed on a map. The position is a location where the equipment is installed. The state is a state of a fault after a predetermined number of years have passed since the equipment had been installed on the position.

In other embodiments, a method for controlling an area characteristic display device may include, but is not limited to, receiving, by an inputter, input of information that enables identification of state and position of equipment installed outdoors; and displaying, by a display controller, based on the information that enables identification of the state and position that has been input to the inputter, and data on area characteristics, a distribution of the state together with the data on area characteristics, on a display with being superimposed on a map. The position is a location where the equipment is installed. The state is a state of a fault after a predetermined number of years have passed since the equipment had been installed on the position. The data on area characteristics is a roughness length in a roughness length distribution chart.

In other embodiments, a method for controlling an area characteristic display device may include, but is not limited to, receiving, receiving, by an inputter, input of information that enables identification of state and position of equipment installed outdoors; and displaying, by a display controller, based on the information that enables identification of the state and position that has been input to the inputter, and data on area characteristics, a distribution of the state together with the data on area characteristics, on a display with being superimposed on a map. The position is a location where the equipment is installed. The state is a state of a fault after a predetermined number of years have passed since the equipment had been installed on the position. The data on area characteristics is data on an environment condition that causes the state.

In other embodiments, a method for controlling an area characteristic display device may include, but is not limited to, receiving, by an inputter, input of information that enables identification of state and position of equipment installed outdoors; and displaying, by a display controller, based on the information that enables identification of the state and position that has been input to the inputter, and data on area characteristics, a distribution of the state together with the data on area characteristics, on a display with being superimposed on a map. The position is a location where the equipment is installed. The state is a state of a fault after a predetermined number of years have passed since the equipment had been installed on the position.

The term "facility" used in embodiments refers to every tangible thing, which can in generally be designed, constructed, built, manufactured, installed, and maintained for performing any purpose, activities or functions in human society. In some cases, the facility may include, but is not limited to, a permanent, semi-permanent or temporary commercial or industrial property such as building, plant, or structure for performing any purpose, activities or functions in human society.

The term "event" used in embodiments refers to something that happens such as a social occasion or activity.

The term "equipment" used in embodiments refers to a set of one or more tangible articles or physical resources such as, but not limited to, some structural or tangible elements, apparatus, devices, or implements used in an operation or activity; fixed assets other than land and buildings.

The term "equipment/material" used in embodiments refers to at least one of equipment and material, for example, equipment alone, material alone or in combination.

In the area characteristic display device of the present invention, the display controller displays, based on the information that enables identification of the state and position that has been input to the inputter, and the data on area characteristics, the distribution of the state together with the data on area characteristics, on the display with being superimposed on a map. Thus, an image for enabling easy comparison between the state distribution of the equipment and area characteristics can be provided. In addition, the area characteristic display device becomes capable of performing evaluation determination of changing the design criterion of the equipment, based on a display result displayed on the display.

Further features and aspects of the present disclosure will become apparent from the following detailed description of exemplary embodiments with reference to the attached drawings.

An area characteristic display device of the present invention is an area characteristic display device which displays, based on information that enables identification of the state and position of equipment installed outdoors, and data on area characteristics, a state distribution together with the data on area characteristics, on a display with being superimposed on a map. The description of the present embodiment is given using power equipment as equipment.

FIG. 1 is a diagram representing a configuration of an area characteristic display device. An area characteristic display device 1 includes a power equipment position information database 2, an inputter 3, an area characteristic database 4, a display controller 5, and a communicator 6. In addition, the area characteristic display device 1 is connected via a network 7 such as the Internet, to a terminal device 8 including a display.

Figure 2:
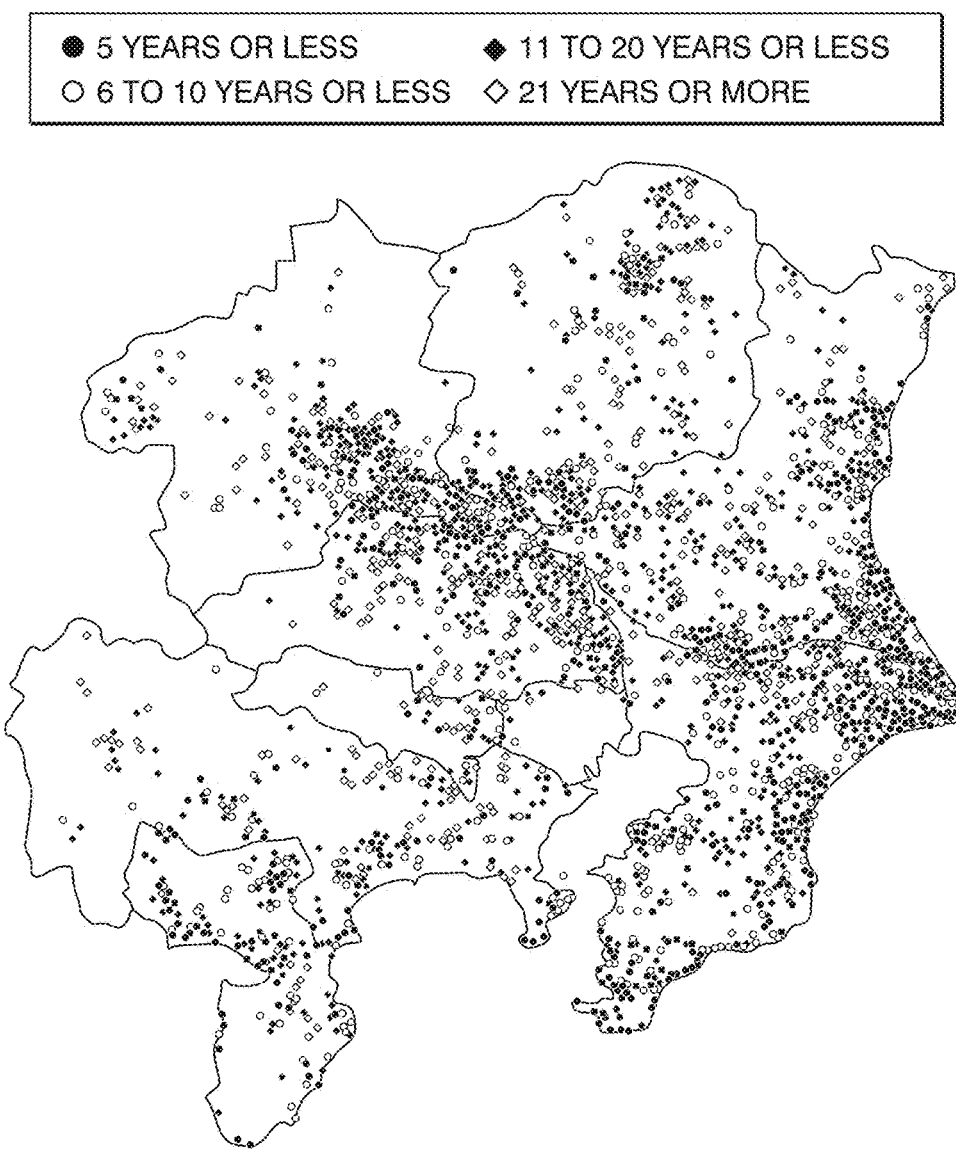
FIG. 2 is a diagram representing information that enables identification of the state and position of power equipment.

The power equipment position information database 2 stores information that enables identification of the state and position of the power equipment. FIG. 2 is a diagram representing information that enables identification of the state and position of the power equipment. In the area characteristic display device of the present embodiment, a coated bind wire installed outdoors is used as an example of power equipment. The position of the coated bind wire refers to a location where the coated bind wire is installed. In addition, the state of the coated bind wire refers to a fault that involves the coated bind wire breakage that occurs after years (a predetermined number of years) have passed since the coated bind wire had been installed. FIG. 2 represents the coated bind wire fault occurrence locations in the respective cases in which the predetermined number of years is 5 years or less (up to 5 years), 6 years or more and 10 years or less (6 to 10 years), 11 years or more and 20 years or less (11 to 20 years), and 21 years or more (from 21 years).

The inputter 3 receives, from the power equipment position information database 2, the information that enables identification of the state and position of the coated bind wire. The inputter 3 outputs the information that enables identification, to the display controller 5.

In the present embodiment, the area characteristic database 4 is a database storing a roughness length in a roughness length distribution chart (data on area characteristics). The roughness length is an index indicating the aerodynamic resistance of a plane. The larger the roughness length is, the larger the aerodynamic resistance is and the smaller the wind velocity is. In addition, the smaller the roughness length is, the larger the aerodynamic resistance is and the larger the wind velocity is (wind fluidity increases).

The roughness length in the roughness length distribution chart is input to the display controller 5 from the area characteristic database 4. Based on information that enables identification of a fault that involves the coated bind wire breakage and the occurrence location of the fault, and the roughness length in the roughness length distribution chart, the display controller 5 generates an image in which the distribution of the coated bind wire breakage and the roughness length are superimposed on a map, and controls the communicator 6 to transmit the generated image to the terminal device 8.

The terminal device 8 is a terminal device such as a mobile phone, a tablet terminal, and a personal computer (PC) that is connected via the network 7 to the area characteristic display device 1, which is a server. Using a browser function, for example, the terminal device 8 accesses the area characteristic display device 1 and acquires an image to display the acquired image.

Figure 3:
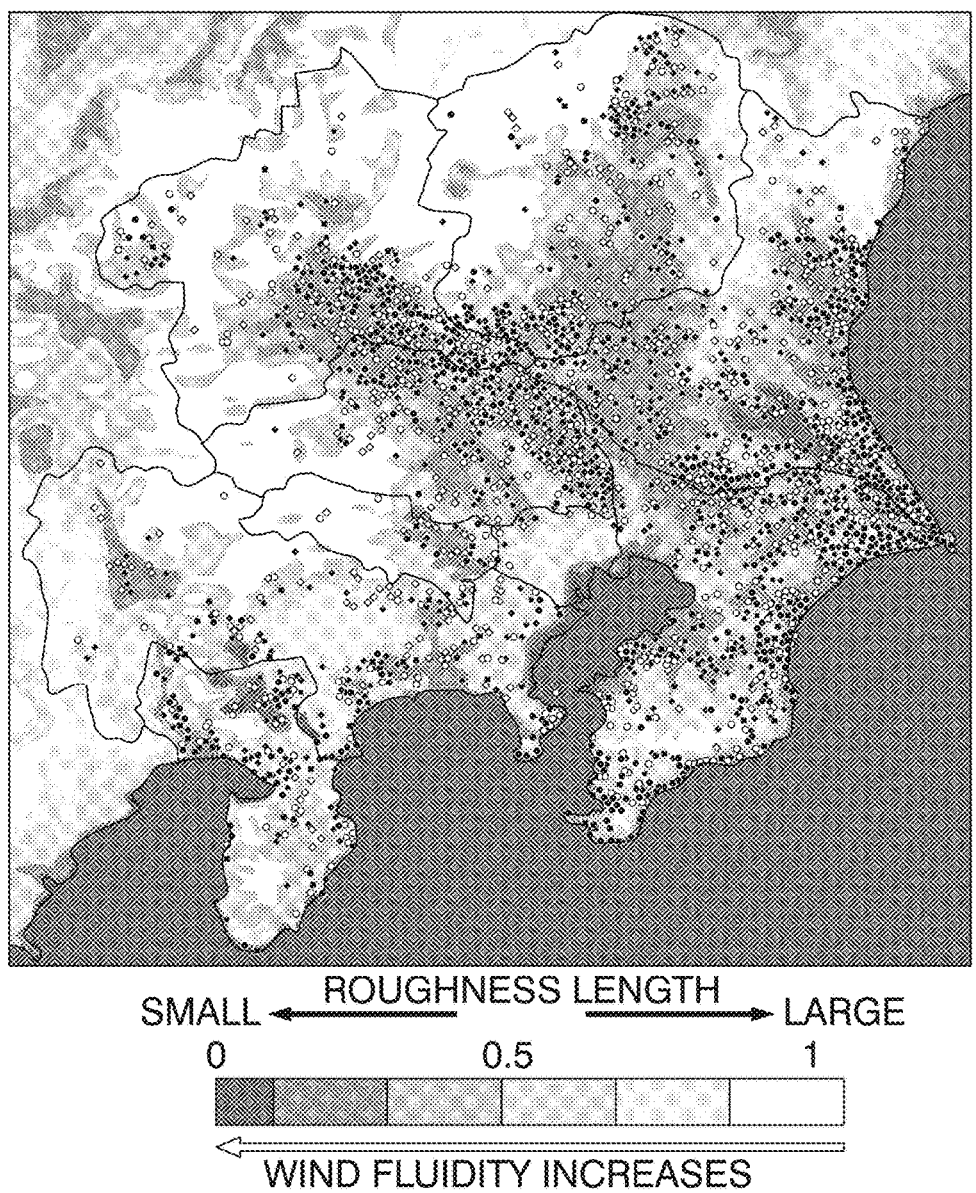
FIG. 3 is a diagram representing a map displayed on a terminal device 8 by a display controller 5.
Figure 4:
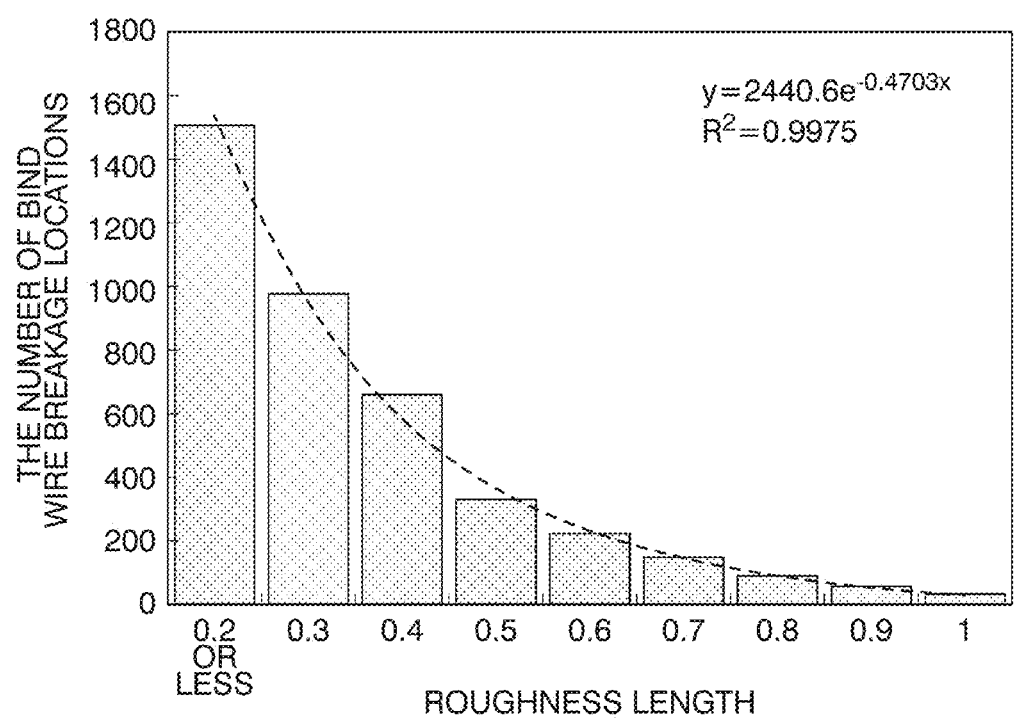
FIG. 4 is a diagram representing a relationship between a roughness length and a bind wire breakage location.

FIG. 3 is a diagram representing a map displayed on the terminal device 8 by the display controller 5. In addition, FIG. 4 is a diagram representing a relationship between a roughness length and a bind wire breakage location. As illustrated in FIG. 3, it can be seen that the smaller the roughness length is, the larger the number of faults that involve the coated bind wire breakage. In addition, as illustrated in FIG. 4, it can be seen that there is high correlation between the roughness length and the number of bind wire breakage locations. More specifically, it has been found out that the fault that involves the coated bind wire breakage is attributed to fatigue breakage caused by wind, and is attribute to the strength poverty of the coated bind wire.

The area characteristic display device 1 of the present embodiment realizes displaying, based on information that enables identification of the breakage (the state of a fault) of a coated bind wire (power equipment) and a fault occurrence location (position), and a roughness length in a roughness length distribution chart (data on area characteristics), the distribution of the coated bind wire breakage together with the roughness length, on the terminal device 8 with being superimposed on a map.

With this configuration, in the area characteristic display device of the present invention, a display controller displays, based on information that enables identification of the state and position that has been input to an inputter, and data on area characteristics, the distribution of the state together with the data on area characteristics, on a display with being superimposed on a map. Thus, an image for enabling easy comparison between the state distribution of power equipment and area characteristics can be provided. In addition, the area characteristic display device becomes capable of performing evaluation determination of changing the design criterion of the power equipment, based on a display result displayed on the display. The change of the design criterion refers to, for example, employing a bind wire having another structure (e.g., bare aluminum bind wire), or employing a bind wire having another structure with hardness enhanced by the change in wire diameter or material, with a shape-memory characteristic, or the like, for repairing the broken point of the wire.

The embodiment of the invention has been described above in detail with reference to the drawings. The specific configuration, however, is not limited to the embodiment, and includes other designs and the like without departing from the scope of the invention. For example, in the embodiment, the area characteristic display device 1 is a cloud service device including the communicator 6, and displaying an image on the terminal device 8 via the network 7. Nevertheless, the area characteristic display device 1 may be a separate device including a display for displaying an image superimposed on a map by the display controller 5. In addition, equipment is not limited to power equipment, and equipment such as the ones for gas, water, and communication may be used.

The apparatus, systems and methods in the above-described embodiments may be deployed in part or in whole through machines, a system of circuits, circuitry, hardware processors that executes computer software, software components, program codes, and/or instructions on one or more machines, a system of circuits, circuitry, hardware processors. In some cases, the one or more machines, a system of circuits, circuitry, hardware processors may be part of a general-purpose computer, a server, a cloud server, a client, network infrastructure, mobile computing platform, stationary computing platform, or other computing platform. One or more processors may be any kind of computational or processing device or devices which are capable of executing program instructions, codes, binary instructions and the like. The one or more hardware processors may be or include a signal processor, digital processor, embedded processor, microprocessor or any variants such as a co-processor, for example, math co-processor, graphic co-processor, communication co-processor and the like that may directly or indirectly facilitate execution of program codes or program instructions stored thereon. In addition, the one or more hardware processors may enable execution of multiple programs, threads, and codes. The threads may be executed simultaneously to enhance the performance of the one or more hardware processors and to facilitate simultaneous operations of the application. Program codes, program instructions and the like described herein may be implemented in one or more threads. The one or more hardware processors may include memory that stores codes, instructions and programs as described herein. The machines, a system of circuits, circuitry, hardware processors may access a non-transitory processor-readable storage medium through an interface that may store codes, instructions and programs as described herein and elsewhere. The non-transitory processor-readable storage medium associated with the machines, a system of circuits, circuitry, hardware processors for storing programs, codes, program instructions or other type of instructions capable of being executed by the computing or processing device may include but may not be limited to one or more of a memory, hard disk, flash drive, RAM, ROM, CD-ROM, DVD, cache and the like.

A processor may include one or more cores that may enhance speed and performance of a multiprocessor. In some embodiments, the process may be a dual core processor, quad core processors, other chip-level multiprocessor and the like that combine two or more independent cores.

The methods, apparatus and systems described herein may be deployed in part or in whole through a machine that executes computer software on a server, client, firewall, gateway, hub, router, or other such computer and/or networking hardware.

The software program may be associated with one or more client that may include a file client, print client, domain client, internet client, intranet client and other variants such as secondary client, host client, distributed client and the like. The client may include one or more of memories, processors, computer readable media, storage media, physical and virtual ports, communication devices, and interfaces capable of accessing other clients, servers, machines, and devices through a wired or a wireless medium, and the like. The programs or codes as described herein may be executed by the client. In addition, other devices required for execution of methods as described in this application may be considered as a part of the infrastructure associated with the client. The client may provide an interface to other devices including servers, other clients, printers, database servers, print servers, file servers, communication servers, distributed servers and the like. This coupling and/or connection may facilitate remote execution of program across the network. The networking of some or all of these devices may facilitate parallel processing of a program or method at one or more location. In addition, any of the devices attached to the client through an interface may include at least one storage medium capable of storing methods, programs, applications, code and/or instructions. A central repository may provide program instructions to be executed on different devices. In this implementation, the remote repository may act as a storage medium for program code, instructions, and programs.

The software program may be associated with one or more servers that may include a file server, print server, domain server, internet server, intranet server and other variants such as secondary server, host server, distributed server and the like. The server may include one or more of memories, processors, computer readable media, storage media, physical and virtual ports, communication devices, and interfaces capable of accessing other servers, clients, machines, and devices through a wired or a wireless medium, and the like. The methods, programs or codes as described herein may be executed by the server. In addition, other devices required for execution of methods as described in this application may be considered as a part of the infrastructure associated with the server. The server may provide an interface to other devices including clients, other servers, printers, database servers, print servers, file servers, communication servers, distributed servers, social networks, and the like. This coupling and/or connection may facilitate remote execution of program across the network. The networking of some or all of these devices may facilitate parallel processing of a program or method at one or more locations. Any of the devices attached to the server through an interface may include at least one storage medium capable of storing programs, codes and/or instructions. A central repository may provide program instructions to be executed on different devices. In this implementation, the remote repository may act as a storage medium for program codes, instructions, and programs.

The methods, apparatus and systems described herein may be deployed in part or in whole through network infrastructures. The network infrastructure may include elements such as computing devices, servers, routers, hubs, firewalls, clients, personal computers, communication devices, routing devices and other active and passive devices, modules and/or components as known in the art. The computing and/or non-computing devices associated with the network infrastructure may include, apart from other components, a storage medium such as flash memory, buffer, stack, RAM, ROM and the like. The processes, methods, program codes, instructions described herein and elsewhere may be executed by one or more of the network infrastructural elements.

The methods, program codes, and instructions described herein may be implemented on a cellular network having multiple cells. The cellular network may either be frequency division multiple access (FDMA) network or code division multiple access (CDMA) network. The cellular network may include mobile devices, cell sites, base stations, repeaters, antennas, towers, and the like. The cell network may be a GSM, GPRS, 3G, EVDO, mesh, or other networks types.

The methods, programs codes, and instructions described herein and elsewhere may be implemented on or through mobile devices. The mobile devices may include navigation devices, cell phones, mobile phones, mobile personal digital assistants, laptops, palmtops, netbooks, pagers, electronic books readers, music players and the like. These devices may include, apart from other components, a storage medium such as a flash memory, buffer, RAM, ROM and one or more computing devices. The computing devices associated with mobile devices may be enabled to execute program codes, methods, and instructions stored thereon. Alternatively, the mobile devices may be configured to execute instructions in collaboration with other devices. The mobile devices may communicate with base stations interfaced with servers and configured to execute program codes. The mobile devices may communicate on a peer to peer network, mesh network, or other communications network. The program code may be stored on the storage medium associated with the server and executed by a computing device embedded within the server. The base station may include a computing device and a storage medium. The storage device may store program codes and instructions executed by the computing devices associated with the base station.

The computer software, program codes, and/or instructions may be stored and/or accessed on machine readable media that may include: computer components, devices, and recording media that retain digital data used for computing for some interval of time; semiconductor storage known as random access memory (RAM); mass storage typically for more permanent storage, such as optical discs, forms of magnetic storage like hard disks, tapes, drums, cards and other types; processor registers, cache memory, volatile memory, non-volatile memory; optical storage such as CD, DVD; removable media such as flash memory, for example, USB sticks or keys, floppy disks, magnetic tape, paper tape, punch cards, standalone RAM disks, Zip drives, removable mass storage, off-line, and the like; other computer memory such as dynamic memory, static memory, read/write storage, mutable storage, read only, random access, sequential access, location addressable, file addressable, content addressable, network attached storage, storage area network, bar codes, magnetic ink, and the like.

The methods and systems described herein may transform physical and/or or intangible items from one state to another. The methods and systems described herein may also transform data representing physical and/or intangible items from one state to another.

The modules, engines, components, and elements described herein, including in flow charts and block diagrams throughout the figures, imply logical boundaries between the modules, engines, components, and elements. However, according to software or hardware engineering practices, the modules, engines, components, and elements and the functions thereof may be implemented on one or more processors, computers, machines through computer executable media, which are capable of executing program instructions stored thereon as a monolithic software structure, as standalone software modules, or as modules that employ external routines, codes, services, or any combination of these, and all such implementations may be within the scope of the present disclosure. Examples of such machines may include, but is not limited to, personal digital assistants, laptops, personal computers, mobile phones, other handheld computing devices, medical equipment, wired or wireless communication devices, transducers, chips, calculators, satellites, tablet PCs, electronic books, gadgets, electronic devices, devices having artificial intelligence, computing devices, networking equipment, servers, routers, processor-embedded eyewear and the like. Furthermore, the modules, engines, components, and elements in the flow chart and block diagrams or any other logical component may be implemented on one or more machines, computers or processors capable of executing program instructions. Whereas the foregoing descriptions and drawings to which the descriptions have been referred set forth some functional aspects of the disclosed systems, no particular arrangement of software for implementing these functional aspects should be inferred from these descriptions unless explicitly stated or otherwise clear from the context. It will also be appreciated that the various steps identified and described above may be varied, and that the order of steps may be adapted to particular applications of the techniques disclosed herein. All such variations and modifications are intended to fall within the scope of this disclosure. The descriptions of an order for various steps should not be understood to require a particular order of execution for those steps, unless required by a particular application, or explicitly stated or otherwise clear from the context.

The methods and/or processes described above, and steps thereof, may be realized in hardware, software or any combination of hardware and software suitable for a particular application. The hardware may include a general purpose computer and/or dedicated computing device or specific computing device or particular aspect or component of a specific computing device. The processes may be realized in one or more microprocessors, microcontrollers, embedded microcontrollers, programmable digital signal processors or other programmable device, along with internal and/or external memory. The processes may also, or instead, be embodied in an application specific integrated circuit, a programmable gate array, programmable array logic, or any other device or combination of devices that may be configured to process electronic signals. It will further be appreciated that one or more of the processes may be realized as a computer executable code capable of being executed on a machine readable medium.

The computer executable code may be created using a structured programming language such as C, an object oriented programming language such as C++, or any other high-level or low-level programming language (including assembly languages, hardware description languages, and database programming languages and technologies) that may be stored, compiled or interpreted to run on one of the above devices, as well as heterogeneous combinations of processors, processor architectures, or combinations of different hardware and software, or any other machine capable of executing program instructions.

Thus, in one aspect, each method described above and combinations thereof may be embodied in computer executable code that, when executing on one or more computing devices, performs the steps thereof. In another aspect, the methods may be embodied in systems that perform the steps thereof and may be distributed across devices in a number of ways, or all of the functionality may be integrated into a dedicated, standalone device or other hardware. In another aspect, the means for performing the steps associated with the processes described above may include any of the hardware and/or software described above. All such permutations and combinations are intended to fall within the scope of the present disclosure.

As used herein, the following directional terms "front, back, above, downward, right, left, vertical, horizontal, below, transverse, row and column" as well as any other similar directional terms refer to those instructions of a device equipped with embodiments of the present invention. Accordingly, these terms, as utilized to describe embodiments of the present invention should be interpreted relative to a device equipped with embodiments of the present invention.

Each element for the system, device and apparatus described above can be implemented by hardware with or without software. In some cases, the system, device and apparatus may be implemented by one or more hardware processors and one or more software components wherein the one or more software components are to be executed by the one or more hardware processors to implement each element for the system, device and apparatus. In some other cases, the system, device and apparatus may be implemented by a system of circuits or circuitry configured to perform each operation of each element for the system, device and apparatus.

While the present disclosure includes many embodiments shown and described in detail, various modifications and improvements thereon will become readily apparent to those skilled in the art. Accordingly, the spirit and scope of the present invention is not to be limited by the foregoing examples, but is to be understood in the broadest sense allowable by law.

What is claimed is:

1. An area characteristic display device comprising:
   an input device that receives inputs of information that enables identification of respective positions of a plurality of equipment, the plurality of equipment are installed outdoors and are fatigue-damageable dependent upon area-environmental conditions, wherein the input device further receives input of information that enables identification of respective states of fault of the plurality of equipment fatigue-damaged dependent upon the area-environmental conditions over time after predetermined periods of time have passed since the plurality of equipment were installed on the respective positions; and
   a display control device that displays, on a display device, an area map based on i) the information that enables identifications of the respective states of fault of the plurality of equipment, ii) the respective positions of the plurality of equipment that the input device received, and iii) data of area characteristics of the area-environmental conditions, the area map superimposed with:
      a distribution of the respective states of fault of the plurality of equipment over the area map positions corresponding to the respective positions of the plurality of equipment; and
      the area characteristics of the area-environmental conditions.

2. An area characteristic display method comprising:
   receiving input of information that enables identification of respective positions of a plurality of equipment, the plurality of equipment are installed outdoors and are fatigue-damageable dependent upon area-environmental conditions;
   receiving input of information that enables identification of respective states of fault of the plurality of equipment fatigue-damaged dependent upon the area-environmental conditions over time after predetermined periods of time have passed since the plurality of equipment were installed on the respective positions; and
   displaying, on a display, an area map based on i) the information that enables identifications of the respective states of fault of the plurality of equipment, ii) the respective positions of the plurality of equipment that the input device received, and iii) data of area characteristics of the area-environmental conditions, the area map superimposed with:
      a distribution of the respective states of fault of the plurality of equipment at area map positions corresponding to the respective positions of the plurality of equipment; and
      the area characteristics of the area-environmental conditions.

3. The area characteristic display device according to claim 1, wherein the plurality of equipment, which are fatigue-damageable dependent upon area-environmental conditions, are fatigue-damageable by wind.

4. The area characteristic display method according to claim 2, wherein the plurality of equipment, which are fatigue-damageable dependent upon area-environmental conditions, are fatigue-damageable by wind.

5. The area characteristic display device according to claim 1, wherein the plurality of equipment includes one or more of power equipment, gas equipment, water equipment, and communication equipment.

6. The area characteristic display method according to claim 2, wherein the plurality of equipment includes one or more of power equipment, gas equipment, water equipment, and communication equipment.

* * * * *